(12) United States Patent
Kim et al.

(10) Patent No.: US 8,399,184 B2
(45) Date of Patent: Mar. 19, 2013

(54) METHOD FOR LASER INTERFERENCE LITHOGRAPHY USING DIFFRACTION GRATING

(75) Inventors: Tae-Su Kim, Daejeon (KR); Jae-Jin Kim, Seoul (KR); Hyun-Woo Shin, Gwacheon-si (KR)

(73) Assignee: LG Chem, Ltd., Seoul (KR)

( * ) Notice: Subject to any disclaimer, the term of this patent is extended or adjusted under 35 U.S.C. 154(b) by 348 days.

(21) Appl. No.: 12/738,598

(22) PCT Filed: Oct. 8, 2008

(86) PCT No.: PCT/KR2008/005892
§ 371 (c)(1),
(2), (4) Date: Jul. 15, 2010

(87) PCT Pub. No.: WO2009/051366
PCT Pub. Date: Apr. 23, 2009

(65) Prior Publication Data
US 2010/0279233 A1 Nov. 4, 2010

(30) Foreign Application Priority Data
Oct. 17, 2007 (KR) ........................ 10-2007-0104584

(51) Int. Cl.
*G03F 7/20* (2006.01)
(52) U.S. Cl. ........................... 430/322; 430/5
(58) Field of Classification Search .................. 430/322, 430/5
See application file for complete search history.

(56) References Cited

U.S. PATENT DOCUMENTS

| 6,185,019 | B1 | 2/2001 | Hobbs | |
|---|---|---|---|---|
| 6,236,476 | B1 | 5/2001 | Son et al. | |
| 2002/0197011 | A1* | 12/2002 | Liu et al. | 385/37 |
| 2008/0079919 | A1* | 4/2008 | Ito | 355/53 |

FOREIGN PATENT DOCUMENTS

| CN | 1945439 A | 4/2007 |
|---|---|---|
| JP | 2000-056135 A | 2/2000 |
| WO | WO 99-59035 A1 | 11/1999 |
| WO | WO 2005/119368 | * 12/2005 |

* cited by examiner

*Primary Examiner* — Brittany Raymond
(74) *Attorney, Agent, or Firm* — McKenna Long & Aldridge LLP

(57) ABSTRACT

A method for laser interference lithography using a diffraction grating includes (a) forming a photoresist layer on a work substrate to which a repeated fine pattern is to be formed; (b) forming a refractive index matching material layer on the photoresist layer; (c) forming on the refractive index matching material layer a diffraction grating layer having a period of diffraction grating within the range from $\lambda/n_g$ to $\lambda/n_0$ ($\lambda$ is a wavelength of laser beam, $n_g$ is a refractive index of the diffraction grating, and $n_0$ is a refractive index in the air or in vacuum); and (d) exposing the photoresist layer by means of mutual interference of positive and negative diffracted lights with the same absolute value by inputting a laser beam perpendicularly to the diffraction grating layer. This method allows to realize an interference pattern with higher resolution and to use a laser source with lower coherence.

10 Claims, 5 Drawing Sheets

METHOD FOR LASER INTERFERENCE LITHOGRAPHY USING DIFFRACTION GRATING

This application is a 35 U.S.C. §371 National Stage entry of International Application No. PCT/KR2008/005892, filed on Oct. 8, 2008, and claims priority to Korean Application No. 10-2007-0104584, filed on Oct. 17, 2007, which are all hereby incorporated by reference in their entireties.

TECHNICAL FIELD

The present invention relates to a method for laser interference lithography using a diffraction grating, and more particularly to a method for laser interference lithography using a diffraction grating, which may implement a high resolution (sub-micrometer) pattern using interference of positive and negative diffracted lights with the same absolute diffracted value in a diffraction grating by inputting a laser source perpendicularly to the diffraction grating.

BACKGROUND ART

Generally, laser interference lithography is a technique for conducting exposure to light by using an interference pattern occurring in an overlap region of light with high coherence, which has several traveling wave vectors. Namely, the laser interference lithography is a technique for exposing an interference pattern formed in a light overlap region to a photoresist layer and then developing it. The laser interference lithography is recently spotlighted since it allows to realize a large sub-micrometer pattern in an easy and inexpensive way. The laser interference lithography has a weak point in that it just allows formation of a regular pattern. However, since most patterns demanded in the nano technology have standardized regular patterns, the above weak point does not cause much trouble.

Basic principle of the laser interference lithography can be understood by means of the interference of electromagnetic waves, made in a region where two parallel lights E1 and E2 with different traveling directions are overlapped, as shown in FIG. 1. The parallel lights E1 and E2 are expressed on the assumption that the lights has no phase difference in a direction orthogonal to their traveling directions. The parallel lines of E1 and E2 exhibit the same light phase.

As well known in the art, a wave causes constructive interference at a position with the same phase and destructive interference at a position with different phases. Since light is a kind of wave, the same principle is identically applied thereto. E1 and E2 can be expressed as in the following equation 1.

$$E1(r) = A e^{j\vec{k}_r \cdot r}$$

$$E2(r) = a e^{j\vec{k}_s \cdot r} \quad \text{Equation 1}$$

where A and a are intensity of electromagnetic wave, and Kr and Ks are wave vectors of E1 and E2.

Meanwhile, the intensity of light is proportional to square of the magnitude of electromagnetic wave, so the intensity profile of light in an overlap region can be expressed as in the following equation 2.

$$I(r) = |E1 + E2|^2 \quad \text{Equation 2}$$

$$= |A|^2 + |a|^2 + 2|A||a| \cos\left[(\vec{k}_r - \vec{k}_s) \cdot r + \phi\right]$$

Seeing the equation 2, it would be found that the intensity profile of light in a region where E1 and E2 are overlapped is expressed as a periodic function such as a trigonometrical function. Here, the period can be calculated from the equation 2 as in the following equation 3.

$$\Lambda = \frac{\lambda}{2\sin\theta} \quad \text{Equation 3}$$

Seeing the equation 3, it would be understood that the period in the overlap region has a close relation with interference angle and wavelength.

The laser interference lithography uses the phenomenon that the intensity profile of light is locally changed in a region where two laser lights cause constructive interference, so a repeated fine pattern can be obtained if a photoresist layer is exposed to an overlapped interference pattern region and then developed. According to the equation 3, it could be understood that a minimum pitch of the fine pattern formable by the laser interference lithography is ½ of the laser wavelength.

FIG. 2 is a graph showing a change of resolution (pitch) of a fine pattern according to an interference angle of laser in case a laser source used in the laser interference lithography is 266 nm in wavelength.

As shown in FIG. 2, it would be understood that the pitch of fine pattern is decreased as an interference angle of laser is increased. It would be understood that the pitch of fine pattern converges to 133 nm. This number is a pitch of fine line width obtainable when the interference angle of laser is 90 degrees, which is corresponding to ½ of the laser wavelength. However, in case the interference angle is 90 degrees, the laser is guided in parallel with the upper surface of the photoresist layer, so its actual realization is substantially considered as being impossible.

Meanwhile, there is recently proposed a method for applying laser interference lithography after forming a diffraction mask on the photoresist layer in order to further decrease the pitch when a fine pattern is formed using laser interference lithography. Generally, this method is classified into interfering $0^{th}$ and $-1^{st}$ diffracted lights with each other or interfering $\pm 1^{st}$ diffracted lights with each other. However, the method using $0^{th}$ and $-1^{st}$ diffracted lights allows formation of a fine pattern with a pitch identical to a period of the diffraction grating, and the method using $\pm 1^{st}$ diffracted lights allows formation of an interference pattern with a pitch that is ½ of a period of the diffraction grating.

Thus, as the period of the diffraction grating is smaller, a finer pattern may be formed. However, due to the physical limit, it is practically impossible to make a diffraction mask having a grating period that is ½ or less of the wavelength of the laser source.

In recent, immersion lithograph is more spotlighted in order to enhance resolution of laser interference lithography. The immersion lithography uses that a wavelength of electromagnetic wave is shortened in a medium with a high refractive index, and a prism is frequently used.

FIG. 3 is a schematic view for illustrating the conventional immersion interference lithography using a prism.

As shown in FIG. 3, in case a prism 4 is used, the prism 4 is added onto a photoresist layer 2 formed on an upper surface of a work substrate 1, and then the immersion interference lithography is conducted. The immersion interference lithography using the prism 4 forms an interference pattern using two incident lights A perpendicularly inputting to a speculum of the prism 4. In case there is no prism, the period of the interference pattern becomes $\lambda/2 \sin \theta$. However, if the prism 4 is used, assuming that the prism 4 has a refractive index of n, the inside wavelength becomes $\lambda/n$, so the pattern period is decreased to $\lambda/2 n \sin \theta$, which further enhances resolution of the fine pattern rather than an existing method. However, in case of the immersion interference lithography using the prism 4, an index matching liquid 3 should be used for matching of refractive indexes between the prism 4 and the photoresist layer 2. if the index matching liquid 3 is not used, an air gap may occur between the prism 4 and the photoresist layer 2, so stains may be created on the exposed pattern. In addition, since the intensity of light causing constructive interference is decreased due to the total reflection in the prism 4, the degree of definition of the fine pattern is deteriorated.

Also, the immersion interference lithography using a prism demands an additional device for immersion, so the equipment for alignment of optical systems are required and thus it is not suitable for mass production. In case a large prism is required, the laser lithography equipment should be also enlarged. Further, a laser source with high coherence should be used similarly to the existing laser interference lithography, which is also designated as an obstacle in mass production.

DISCLOSURE

[Technical Problem]

The present invention is designed to solve the problems of the prior art, and therefore it is an object of the present invention to provide a method for laser interference lithography using a diffraction grating, which may enhance process convenience and resolution of a pattern rather than a conventional laser interference lithography and also may use a light source with low coherence.

[Technical Solution]

In order to accomplish the above object, the present invention provides a method for laser interference lithography using a diffraction grating, which includes (a) forming a photoresist layer on a work substrate to which a repeated fine pattern is to be formed; (b) forming a refractive index matching material layer on the photoresist layer; (c) forming on the refractive index matching material layer a diffraction grating layer having a period of diffraction grating within the range from $\lambda/n_g$ to $\lambda/n_0$ ($\lambda$ is a wavelength of laser beam, $n_g$ is a refractive index of the diffraction grating, and $n_0$ is a refractive index in the air or in vacuum); and (d) exposing the photoresist layer by means of mutual interference of positive and negative diffracted lights with the same absolute value by inputting a laser beam perpendicularly to the diffraction grating layer.

Preferably, the photoresist layer is exposed by means of mutual interference of $+1^{st}$ diffracted light and $-1^{st}$ diffracted light.

In the present invention, the refractive index matching material layer may be an index matching liquid layer.

Preferably, the refractive index matching material layer has a refractive index allowing anti-reflection of diffracted light at a border between the diffraction grating layer and the photoresist layer. For example, the refractive index matching material layer has a refractive index identical to that of the diffraction grating layer or the photoresist layer.

Preferably, a BARC (Bottom Anti Reflection Coater) is interposed between the work substrate and the photoresist layer.

In the present invention, the diffraction grating layer is preferably a Bragg grating layer.

In the present invention, the diffraction grating layer may include a glass substrate; a BARC formed on the glass substrate; and a repeated grating pattern formed on the BARC.

In the present invention, the photoresist layer may be a photoresist layer of i-line series or DUV (Deep Ultra Violet) series.

In the present invention, the diffraction grating layer may have a grating pattern whose sectional shape is rectangular, trapezoidal or triangular.

[Advantageous Effects]

According to the present invention, since a laser beam is inputted perpendicularly to a diffraction grating and thus $\pm 1^{st}$ diffracted lights are used for laser interference lithography, it is possible to realize an interference pattern with higher resolution than a conventional case. Also, this method allows to use a light source with low coherence, and enables mass production by simplifying an optical system and thus enhancing process convenience.

Figure 1:
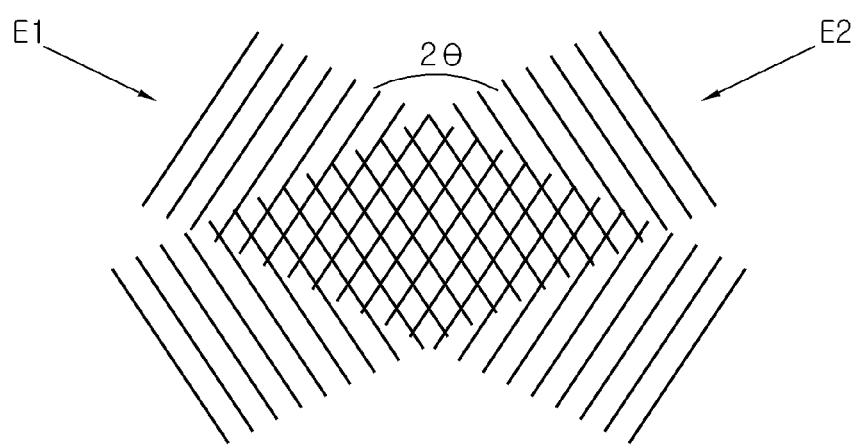
FIG. 1 is a schematic view showing interference of two parallel lights.
Figure 2:
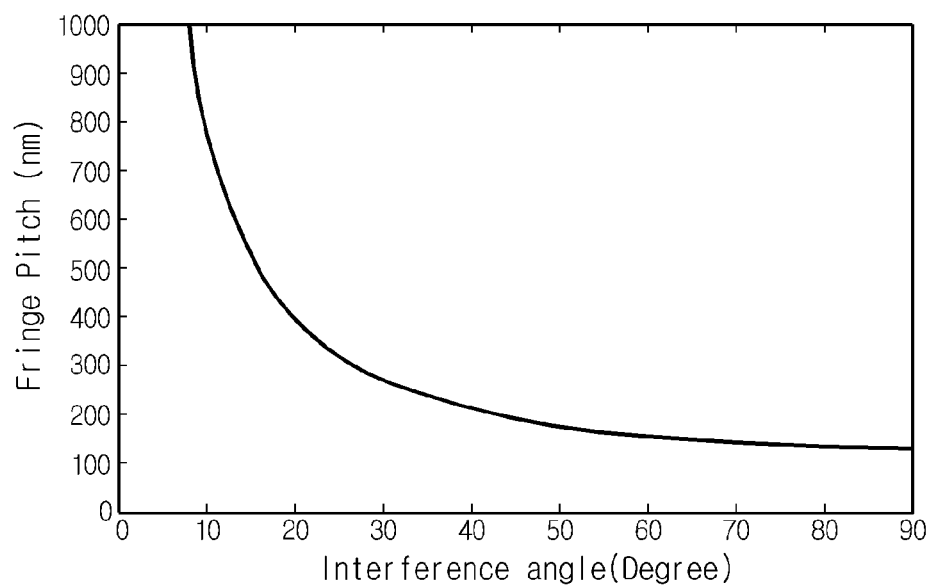
FIG. 2 is a graph showing the change of resolution (pitch) of a fine pattern according to an interference angle of laser in case a laser source used for laser interference lithography is 266 nm in wavelength.
Figure 3:
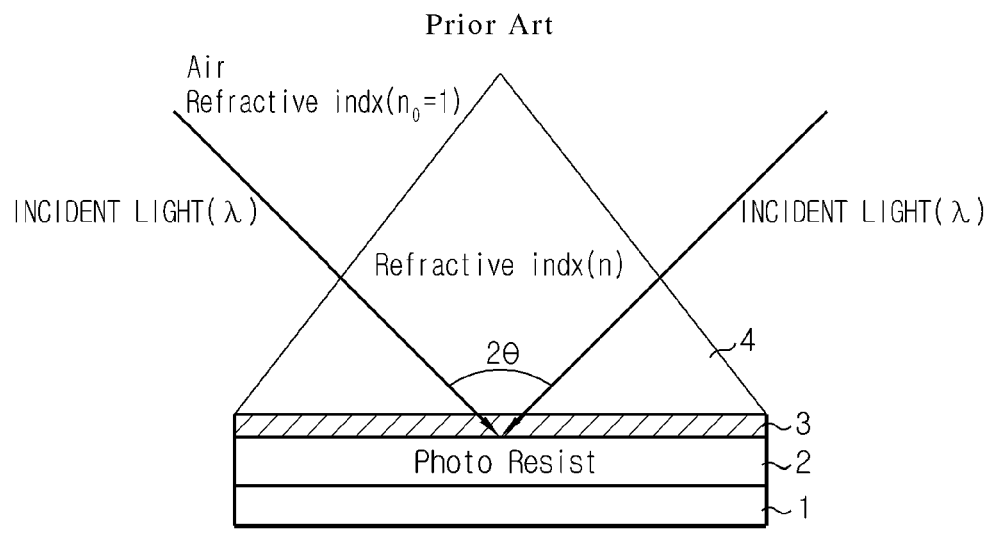
FIG. 3 is a schematic view for illustrating a conventional immersion interference lithography using a prism.

<Reference Numerals of Essential Parts in the Drawings>

| | |
|---|---|
| 1: laser beam | 10: laser source |
| 20: reflection mirror | 30: beam expander |
| 40: lithography object | 41: work substrate |
| 42: photoresist layer | 43: refractive index matching material layer |
| 44: diffraction grating layer | 45: glass substrate |
| 46: BARC | 47: repeated grating pattern |

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 4:
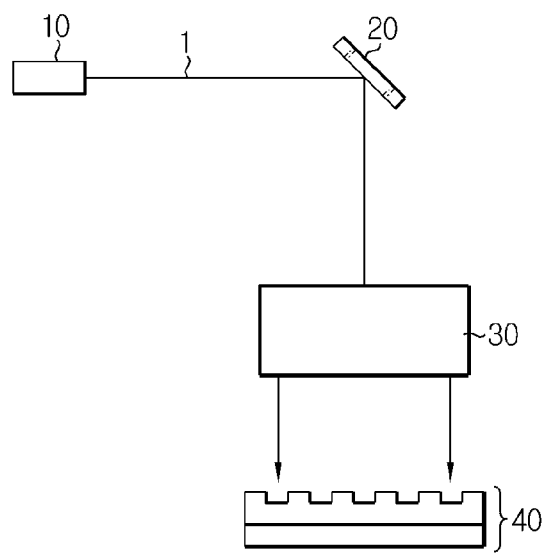
FIG. 4 is a schematic view showing a laser interference lithography apparatus according to a preferred embodiment of the present invention.

FIG. 4 is a schematic view showing a laser interference lithography apparatus according to a preferred embodiment of the present invention.

Referring to FIG. 4, the laser interference lithography apparatus according to the present invention includes a laser source 10 for generating a laser beam 1, a reflection mirror 20 for guiding the laser beam 1 to a desired direction, a beam expander 30 for expanding a diameter of the laser beam 1, and a lithography object 40.

The laser interference lithography apparatus guides the laser beam 1 generated from the laser source 10 to a targeted direction by means of the reflection mirror 20. The beam expander 30 expands the diameter of the laser beam 1 and inputs the expanded laser beam 1 perpendicularly to the lithography object 40, thereby forming an interference pattern on the lithography object 40.

Figure 5:
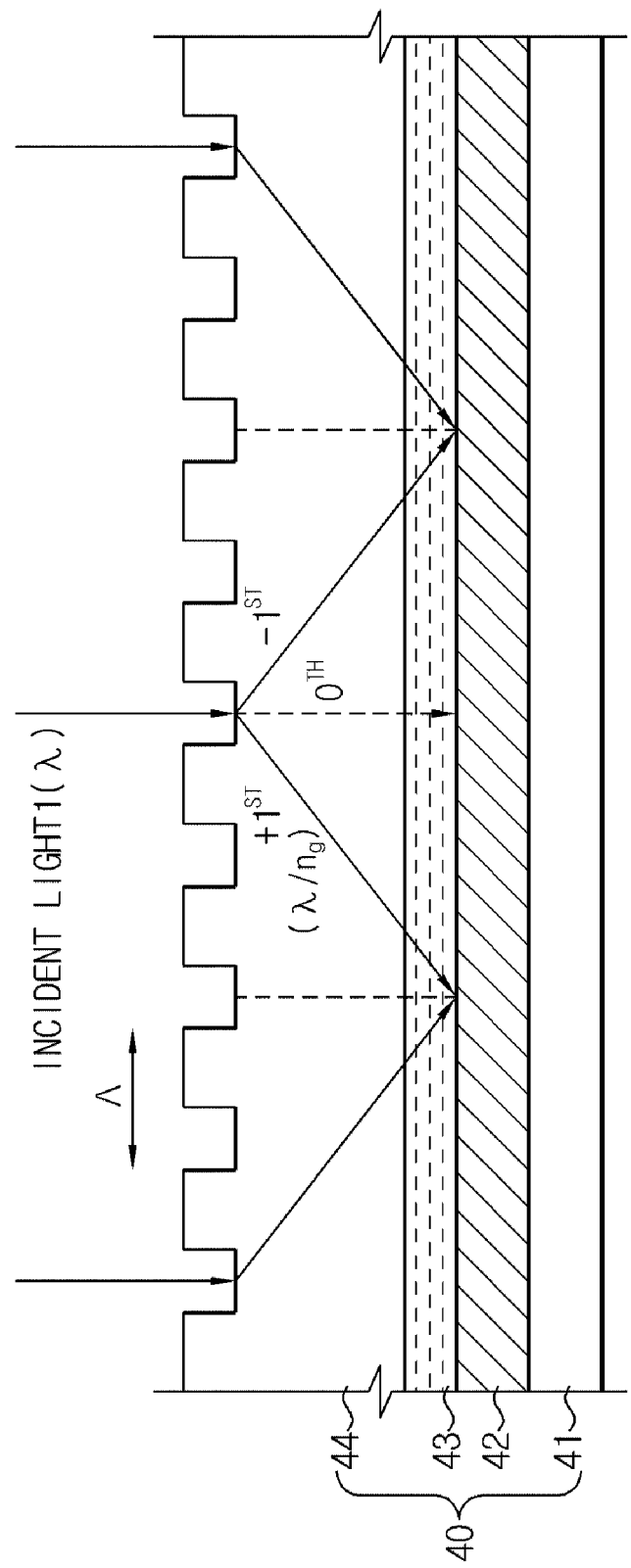
FIG. 5 is a sectional view for illustrating a method for laser interference lithography according to a preferred embodiment of the present invention.

FIG. 5 is a sectional view for illustrating a method for laser interference lithography according to a preferred embodiment of the present invention.

Referring to FIG. 5, the lithography object 40 includes a work substrate 41, a photoresist layer 42, a refractive index matching material layer 43 and a diffraction grating layer 44.

According to the present invention, a laser incident light $\lambda$ is perpendicularly input to a surface of the diffraction grating layer 44. Here, it is preferred that the period of the diffraction grating layer 44 is designed as being limited within the range from $\lambda/n_g$ to $\lambda/n_0$. Here, $\lambda/n_g$ is a light wavelength in the diffraction grating layer 44, and $\lambda/n_0$ is a light wavelength in the air or in vacuum.

The incident light $\lambda$ perpendicularly input onto the diffraction grating layer 44 is diffracted into positive and negative diffracted lights with the same absolute value at each grating pattern point. Preferably, in the present invention, the photoresist layer 42 below the diffraction grating layer 44 is exposed to light by means of interference of $\pm 1^{st}$ diffraction components among the diffracted lights.

At this time, the period of the diffraction grating layer 44 has a value within the range from a light wavelength $\lambda/n_g$ in the diffraction grating layer 44 to a light wavelength $\lambda/n_0$ in the air or in vacuum. Thus, the incident light input to the diffraction grating layer 44 is diffracted over a critical angle in the diffraction grating layer 44. For reference, according to the above equation 3, since the period of the interference pattern can be theoretically decreased as the interference angle (identical to the diffraction angle) is nearer to 90 degrees, it is preferred in formation of a fine pattern to increase the diffraction angle. However, if the diffraction grating layer 44 is designed within the numerical range proposed in the present invention, the diffraction angle can be increased over a critical angle, while a diffracted light diffracted over the critical angle causes total reflection in the diffraction grating layer 44 and thus does not form an interference pattern on the photoresist layer 42 but it is guided in the inside of the diffraction grating layer 44. In order to prevent this problem, in the present invention, the refractive index matching material layer 43 for matching of refractive indexes is interposed between the photoresist layer 42 and a lower portion of the diffraction grating layer 44. Preferably, the refractive index matching material layer 43 may employ water or an index matching liquid layer provided from a photoresist manufacturer. However, the present invention is not limited in the kind of index matching liquid layers. Preferably, the refractive index matching material layer 43 has a refractive index identical to that of the photoresist layer 42 or the diffraction grating layer 44. If the refractive index matching material layer 43 is formed as above, it is possible to prevent a diffracted light diffracted over a critical angle from being guided inside the diffraction grating layer 44 due to total reflection. Accordingly, it is possible to form an interference pattern on the photoresist layer 42 by the diffracted light.

Meanwhile, if being inputted to the diffraction grating layer 44, the laser incident light $\lambda$ creates a diffraction component suitably for the Bragg condition. A diffraction angle of the diffracted light diffracted inside the diffraction grating layer 44 can be calculated using the Bragg condition as in the following equation 4.

$$\sin\theta = \frac{\lambda}{2\Lambda n_g} \qquad \text{Equation 4}$$
$$\theta = \sin^{-1}\left(\frac{\lambda}{2\Lambda n_g}\right)$$

where $\theta$ is a diffraction angle of the diffracted light, $\Lambda$ is a period of the diffraction grating, $\lambda$ is a wavelength period of the incident light, and $n_g$ is a refractive index of the diffraction grating.

Seeing the equation 4, in case the incident light $\lambda$ is perpendicularly input to the diffraction grating layer 44, since $+1^{st}$ diffracted light and $-1^{st}$ diffracted light have the same diffraction angle, a period of interference pattern of $\pm 1^{st}$ diffracted lights in the diffraction grating layer 44 can be calculated as in the following equation 5.

$$\text{Pitch} = \frac{\lambda/n_g}{2\sin\theta} = \Lambda/2 \qquad \text{Equation 5}$$

where Pitch is a period of the interference pattern of $\pm 1^{st}$ diffracted lights, $\theta$ is a diffraction angle of the diffracted light, $\Lambda$ is a period of the diffraction grating, $\lambda$ is a wavelength period of the incident light, and $n_g$ is a refractive index of the diffraction grating.

Seeing the equation 5, it would be understood that the interference pattern period of $\pm 1^{st}$ diffracted lights diffracted by the diffraction grating layer 44 is ½ of the diffraction grating period $\Lambda$. Thus, it is possible to form a fine interference pattern smaller than ½ of laser wavelength, which was a limit in resolution of the conventional laser interference lithography.

Figure 6:
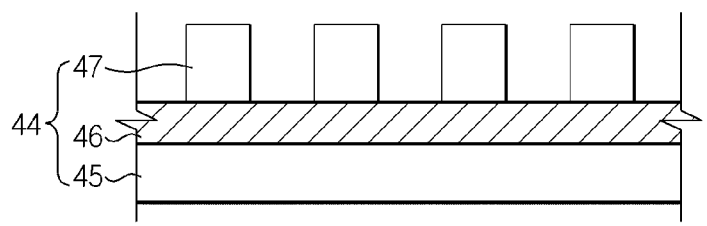
FIG. 6 is a sectional view showing a diffraction grating according to a preferred embodiment of the present invention.

FIG. 6 is a sectional view showing a diffraction grating according to a preferred embodiment of the present invention.

Referring to FIG. 6, the diffraction grating layer 44 includes a glass substrate 45, a BARC (Bottom Anti Reflection Coater) 46, and a repeated grating pattern 47.

The glass substrate 45 is laminated on the photoresist layer 42 formed on the work substrate 41, and it has material and shape allowing transmission of incident light. The material of the glass substrate 45 may employ glass, PMMA (poly methyl methacrylate), TAC (tri-acetyl cellulose), PVA (polyvinyl alcohol), PI (polyimide), PET (polyethylene), PEN (polyethylene naphthalate), PES (polyether sulfones), PC (polycarbonate), COP (cyclic olefin polymer), $SiO_2$ and so on, but the present invention is not limited thereto.

The BARC 46 is formed on the glass substrate 45. The BARC 46 is formed to remove a reflected light among the light input to the glass substrate 45 and diffracted in the glass substrate 45. The BARC 46 gives an influence on the reflected light reflected by the glass substrate 45, thereby facilitating enhancement of the degree of definition of the interference pattern.

The repeated grating pattern 47 is formed on the BARC 46. The repeated grating pattern 47 is preferably made of material allowing diffraction of the incident light, and for example, $SiO_2$, $Si_3N_4$ or glass may be used. The repeated grating pattern 47 is formed as a Bragg grating pattern, and the period of the grating pattern is preferably designed within the range from the light wavelength $\lambda/n_g$ in the glass substrate 45 of the diffraction grating layer 44 to the light wavelength $\lambda/n_0$ in the art or in vacuum. Also, the grating pattern preferably has a section with a rectangular shape, but a trapezoidal or triangular shape is also possible, not limited to the above.

In the laser interference lithography method using the above diffraction grating layer 44, first, a work substrate 41 on which a fine repeated pattern is to be formed is prepared.

Subsequently, the photoresist layer 42 is formed on the work substrate 41. The photoresist layer 42 is preferably formed using a photoresist film in i-line or DUV (Deep Ultra Violet) series. However, the present invention is not limited to the kind of the photoresist layer.

Successively, the refractive index matching material layer 43 is formed on the photoresist layer 42. The refractive index matching material layer 43 prevents a laser beam input to the diffraction grating layer 44, formed later, from being guided within the diffraction grating layer 44 though the laser beam is diffracted over a critical angle.

After that, the diffraction grating layer 44 is formed on the refractive index matching material layer 43. The grating period design conditions and sectional shape of the diffraction grating layer 44 are already explained above.

Then, a laser beam is perpendicularly input onto the diffraction grating layer 44. The perpendicularly input laser beam is diffracted into positive and negative diffracted lights with the same absolute value while passing through the diffraction grating layer 44. Among them, $\pm 1^{st}$ diffracted lights form an interference pattern on the photoresist layer 42, thereby making the photoresist layer 42 be exposed.

After the photoresist layer 42 is exposed, the photoresist layer 42 is developed and etched, thereby making on the work substrate 41 a repeated fine pattern with higher resolution than the conventional laser interference lithography using a laser with the same wavelength.

Also, in the laser interference lithography method according to the present invention, the BARC may be additionally interposed between the work substrate 41 and the photoresist layer 42. In this case, the BARC prevents reflection of the diffracted lights, thereby improving the degree of definition of the repeated fine pattern formed on the work substrate 41.

EXPERIMENTAL EXAMPLE

Hereinafter, the present invention is explained in more detail using an experimental example. However, the following experimental example is for illustration purpose only, not intended to limit the scope of the present invention.

In this experimental example, a diffraction grating was prepared with the same configuration as the diffraction grating shown in FIG. 6. First, a glass substrate was prepared, and a BARC was formed on an upper surface of the glass substrate. Also, a repeated grating pattern was formed on the glass substrate with the BARC by means of photoresist. The repeated grating pattern of the diffraction grating shown in FIG. 6 was formed by etching of $SiO_2$. Meanwhile, in this experimental example, a photoresist material having low durability but not giving serious problem in actual optical features was used to form the grating pattern.

Figure 7:
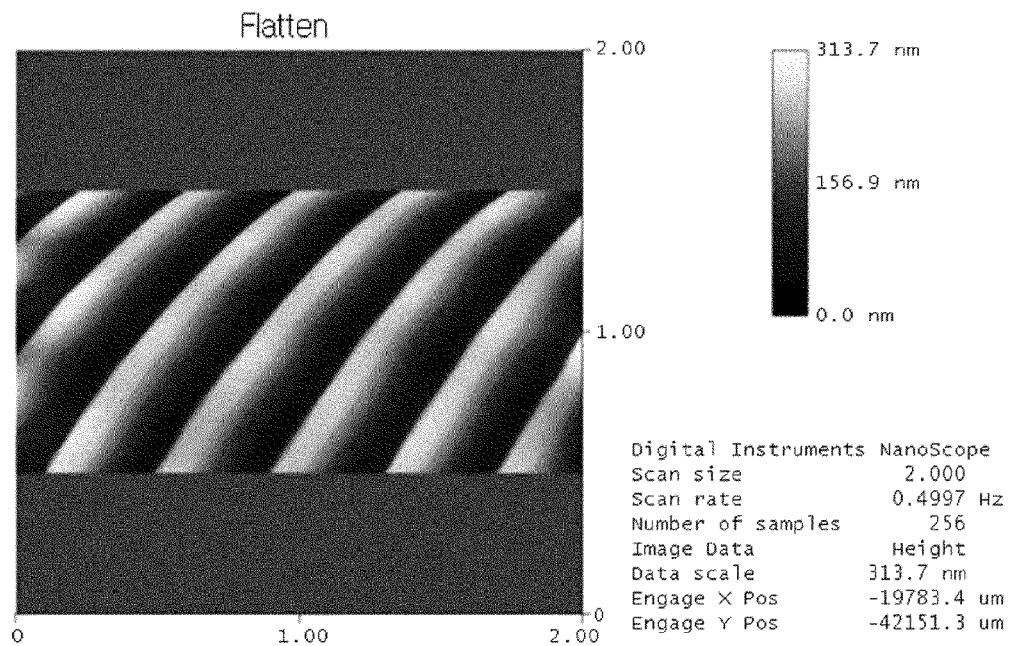
FIG. 7 is a photograph showing a diffraction grating prepared suitably for proposed conditions in an experimental example of the present invention, taken using AFM (Atomic Force Microscope).

FIG. 7 is a photograph showing the diffraction grating prepared suitably for the conditions proposed in this experimental example, taken using AFM (Atomic Force Microscope).

The diffraction grating shown in the photograph has a period of 340 nm, a depth of 170 nm and a filter factor of 30%.

A diffraction efficiency according to each degree of diffraction in the diffraction grating when a laser beam is input to the diffraction grating was calculated RCWA (Rigorous Coupled Wave Analysis). Assuming that the intensity of the laser beam input to the diffraction grating is 1, $\pm 1^{st}$ diffracted light has an intensity of about 0.14, and $0^{th}$ diffracted light has an intensity of about 0.058. In this case, the intensity distribution of light exposed to the photoresist is exhibited as shown in FIG. 8.

Figure 8:
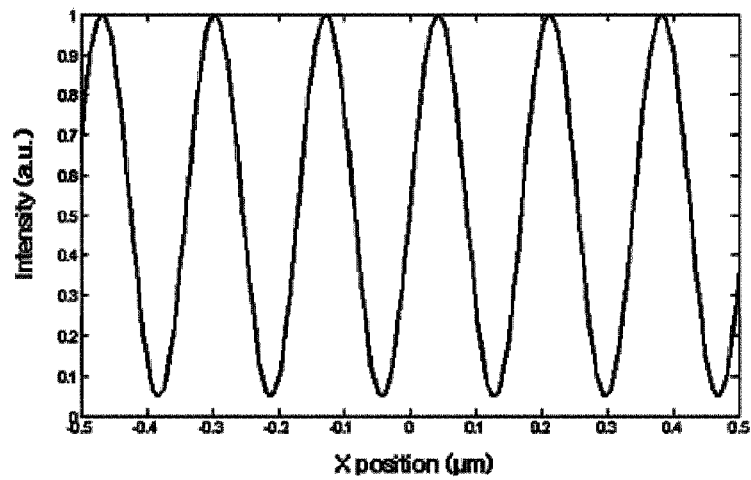
FIG. 8 is a graph showing intensity distribution of light exposed to a photoresist layer when a diffraction grating having the proposed conditions of the experimental example is used.

Referring to FIG. 8, if the photoresist is exposed using the diffraction grating proposed in this experimental example, it would be found that the interference pattern formed on the photoresist may have constant periods.

Figure 9:
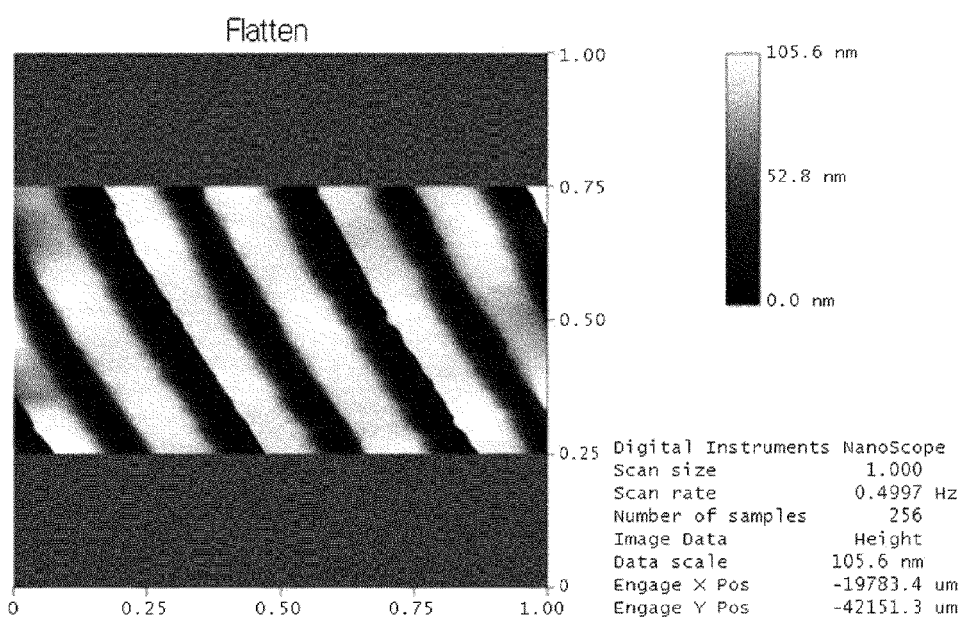
FIG. 9 is a photography showing a pattern formed on a photoresist layer in case a laser beam having a wavelength of 351.1 nm is perpendicularly inputted to the diffraction grating having the proposed conditions of the experimental example for exposure and development of the photoresist layer, taken using AFM.

FIG. 9 is an AFM photograph showing a pattern formed on the photoresist layer in case a laser beam having a wavelength of 351.1 nm is perpendicularly input to the diffraction grating having the conditions proposed in this experimental example to make the photoresist layer be exposed and developed.

As shown in FIG. 9, a glass substrate was selected as a work substrate for patterning of a photoresist layer, and a BARC of 150 nm was formed thereon. After that, a photoresist layer was formed in thickness of 100 nm on the BARC by using ultra i-123 of I-Line series, produced by Shipley.

After that, water was applied as a refractive index matching material layer to an upper portion of the photoresist layer, and then a diffraction grating layer having the diffraction grating layer structure shown in FIG. 6 and the grating design conditions shown in FIG. 7 was laminated on the photoresist layer to make a lithography object.

If the lithography object is completed according to the above procedure, the laser beam having a wavelength of 351.1 nm was perpendicularly input to the diffraction grating layer using the laser lithography apparatus shown in FIG. 4 to form an interference pattern on the photoresist layer and expose the photoresist layer. After that, the photoresist layer was developed, and then it was found that the pattern formed on the photoresist layer had a period of 170 nm, which was smaller than ½ of 351.1 nm that is a wavelength of the laser beam and which was a half of 340 nm that is a period of the diffraction grating.

Thus, it would be understood that, if the photoresist layer is exposed according to the present invention, resolution of a fine pattern formed on the photoresist layer can be improved rather than the conventional laser interference lithography, though only a diffraction grating without a prism is used. Also, it is possible to use a laser source with low coherence to form a fine pattern with the same resolution as a conventional one, which allows reduction of production costs.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention claimed is:

1. A method for laser interference lithography using a diffraction grating, comprising:
   (a) forming a photoresist layer on a work substrate to which a repeated fine pattern is to be formed;
   (b) forming a refractive index matching material layer on the photoresist layer;
   (c) forming on the refractive index matching material layer a diffraction grating layer having a period of diffraction grating within the range from $\lambda/ng$ to $\lambda/n0$ ($\lambda$ is a wavelength of laser beam, ng is a refractive index of the diffraction grating, and n0 is a refractive index in the air or in vacuum); and
   (d) exposing the photoresist layer by means of mutual interference of positive and negative diffracted lights with the same absolute value by inputting a laser beam perpendicularly to the diffraction grating layer.

2. The method for laser interference lithography using a diffraction grating according to claim 1,
   wherein, in the step (d), the photoresist layer is exposed by means of mutual interference of +1st diffracted light and −1st diffracted light.

3. The method for laser interference lithography using a diffraction grating according to claim 1,
   wherein, in the step (b), the refractive index matching material layer is an index matching liquid layer.

4. The method for laser interference lithography using a diffraction grating according to claim 1,
   wherein the refractive index matching material layer has a refractive index allowing anti-reflection of diffracted light at a border between the diffraction grating layer and the photoresist layer.

5. The method for laser interference lithography using a diffraction grating according to claim 1,
   wherein the refractive index matching material layer has a refractive index identical to that of the diffraction grating layer or the photoresist layer.

6. The method for laser interference lithography using a diffraction grating according to claim 1, further comprising:
   forming a BARC (Bottom Anti Reflection Coater) between the work substrate and the photoresist layer.

7. The method for laser interference lithography using a diffraction grating according to claim 1,
   wherein the diffraction grating layer is a Bragg grating layer.

8. The method for laser interference lithography using a diffraction grating according to claim 1, wherein the diffraction grating layer includes:
   a glass substrate;
   a BARC formed on the glass substrate; and
   a repeated grating pattern formed on the BARC.

9. The method for laser interference lithography using a diffraction grating according to claim 1,
   wherein the photoresist layer is a photoresist layer of i-line series or DUV (Deep Ultra Violet) series.

10. The method for laser interference lithography using a diffraction grating according to claim 1,
    wherein the diffraction grating layer has a grating pattern whose sectional shape is rectangular, trapezoidal or triangular.

* * * * *